United States Patent [19]

Gill et al.

[11] Patent Number: 5,060,195
[45] Date of Patent: Oct. 22, 1991

[54] HOT ELECTRON PROGRAMMABLE, TUNNEL ELECTRON ERASABLE CONTACTLESS EEPROM

[75] Inventors: Manzur Gill, Rosharon; Sung-Wei Lin, Houston, both of Tex.

[73] Assignee: Texas Instruments Incorporated, Dallas, Tex.

[21] Appl. No.: 595,521

[22] Filed: Oct. 11, 1990

Related U.S. Application Data

[62] Division of Ser. No. 458,936, Dec. 29, 1989, Pat. No. 5,010,028.

[51] Int. Cl.⁵ .............................................. G11C 11/40
[52] U.S. Cl. .................................... 365/185; 357/23.5
[58] Field of Search ........................ 365/185; 357/23.5

[56] References Cited

U.S. PATENT DOCUMENTS

| | | | |
|---|---|---|---|
| 4,035,820 | 7/1977 | Matzen | 357/23.5 |
| 4,037,242 | 7/1977 | Gosney | 357/23.5 |
| 4,363,109 | 12/1982 | Gardner | 365/185 |
| 4,649,520 | 3/1987 | Eitan | 365/185 |
| 4,668,970 | 5/1987 | Yatsuda et al. | 357/23.5 |
| 4,794,562 | 12/1988 | Kato et al. | 357/23.5 |
| 4,816,883 | 3/1989 | Baldi | 357/23.5 |
| 4,822,750 | 4/1989 | Perlegos et al. | 357/23.5 |
| 4,912,676 | 3/1990 | Patterson et al. | 365/185 |
| 4,924,437 | 5/1990 | Patterson et al. | 365/185 |

Primary Examiner—Joseph E. Clawson, Jr.
Attorney, Agent, or Firm—W. James Brady, III; Melvin Sharp; James T. Comfort

[57] ABSTRACT

An electrically-erasable, electrically-programmable, read-only memory cell array is formed in pairs at a face of a semiconductor substrate (11). Each memory cell includes a source region (14a) and a shaped drain region (16), with at corresponding channel region (18a) in between. A Fowler-Nordheim tunnel window subregion (15a) of the source region (14a) is located opposite the channel (18a). A floating gate conductor (FG) includes a channel section (32a) and a tunnel window section (34a). The floating gate conductor is formed in two stages, the first stage forming the channel section (32a) from a first-level polysilicon (P1A). This floating gate channel section (32a/P1A) is used as a self-alignment implant mask for the source (14a) and drain (16) regions, such that the channel junction edges are aligned with the coresponding edges of the channel section. A control gate conductor (CG) is disposed over the floating gate conductor (FG), insulated by an intervening interlevel dielectric (ILD). The memory cell is programmed by hot carrier injection from the channel (18a) to the floating-gate channel section (32a), and erased by Fowler-Nordheim tunneling from the floating-gate tunnel window section (34a) to the tunnel window subregion (15a).

16 Claims, 5 Drawing Sheets

HOT ELECTRON PROGRAMMABLE, TUNNEL ELECTRON ERASABLE CONTACTLESS EEPROM

This is a division of application Ser. No. 07/458,936, filed Dec. 29, 1989 now U.S. Pat. No. 5,010,028.

RELATED APPLICATIONS

This application discloses subject matter also disclosed in co-pending U.S. patent applications Ser. No. 07/295,079, filed Jan. 9, 1989, abandoned; Ser. No. 07/219,530, abandoned filed July 15, 1988 abandoned; Ser. No. 07/219,528 abandoned, filed July 15, 1988; Ser. No. 07/374,381 filed June 30, 1989; and No. 07/457,990 filed Dec. 28, 1989 now U.S. Pat. No. 4,994,403, assigned to Texas Instruments Inc., the assignee of this invention. These related applications are incorporated by reference.

TECHNICAL FIELD OF THE INVENTION

The present invention relates generally to an electrically erasable and programmable read-only memory (EEPROM), and more particularly to an EEPROM memory cell that is programmed by hot-carrier injection and erased by Fowler-Nordheim tunnel current, and a method of fabricating such a device.

BACKGROUND OF THE INVENTION

An EEPROM, or electrically-erasable and programmable ROM, uses field effect transistors with a floating gate structure in which a programmed charge can be stored on an electrically isolated floating gate to control the threshold voltage $V_T$. A read operation differentiates between the impedance presented by a charged (high $V_T$) gate and an uncharged (low $V_T$) gate, thereby differentiating between logic states of the memory cell. EEPROMs are erasable cell-by-cell, or in a flash-erase mode in which the entire memory array is erased.

EEPROMs use either of two charge transfer mechanisms for programming—Fowler-Nordheim tunneling or hot carrier injection. Fowler-Nordheim tunneling is generally used for erase operations. EEPROMs using hot carrier injection for programming typically employ FAMOS or floating-gate, avalanche-injection MOS, although hot carrier injection results from channel hot electrons as well as avalanche breakdown (assuming NMOS).

Both charge transfer mechanisms have advantages and disadvantages. Programming an EEPROM memory cell by hot carrier injection requires lower voltage than does Fowler-Nordheim tunneling. On the other hand, the higher voltages required for Fowler-Nordheim tunneling can be generated onchip because of the very low tunneling current requirements for programming. In contrast, an additional power supply is required for FAMOS-type EEPROMs because of high programming current requirements. Moreover, floating gate erasure using injection of hot holes is disadvantageous in that these carriers can damage the oxide insulator layer, eventually leading to cell degradation and failure. Using a Fowler-Nordheim tunnel current to erase a floating gate results in significantly less damage to the tunnel window oxide, and therefore is advantageous in terms of memory cell durability and reliability.

EEPROMs using hot carrier injection for programming and Fowler-Nordheim tunneling for erasure have been described in: (a) "A Single Transistor EEPROM cell and its implementation in a 512K CMOS EEPROM," S. Mukherjee, et al., IEDM 1985 (p.616–619), (b) "An In-System Reprogrammable 256K CMOS Flash Memory", V. N. Kynett, et al., ISSCC 1988 (p. 132–133), and (c) "A 128K Flash EEPROM using double polysilicon Technology", George Samachisa et al., ISSCC 1987 (p. 87–88). These EEPROMs employ conventional architecture where the drains of two memory cells share one contact. FAMOS gate oxide thickness is a trade-off between adequate tunneling current for erase in a reasonable time, and the impact on yields/reliability from processing defects. That is, thick gate oxide improves process yields/reliability, but reduces tunnel current leading to long erase times. Moreover, gated junction breakdown voltage is degraded with thin gate oxide, so that, during erase, excessive junction leakage (and the unwanted generation of hot carriers) can occur before the onset of adequate Fowler-Nordheim tunnel erase current. (See, Reference (b) and (c) Thus, these EEPROMs are erased, in part, by hot holes because of low field plate breakdown voltage of the FAMOS source junction.

The approach in Reference (c) uses channel oxide of about 200 Angstroms, and uses channel hot electron injection for programming, and Fowler-Nordheim tunneling for erasure from the same junction. It has two disadvantages: (i) the junction optimization requirements for erasing/programming are incompatible, and cannot be met by the same junction; and (ii) a gate oxide thickness of 200 Angstroms does not allow adequate Fowler-Nordheim tunneling current for reasonable erase times with conventional 12.5 volt EEPROM power supplies. As a result, junction breakdown assisted erase can occur, leading to excessive substrate current during erase.

Thus, EEPROMs, heretofore, have not combined hot carrier injection programming with strictly Fowler-Nordheim tunnel erasing. One problem is that the higher voltages required by Fowler-Nordheim tunnel erasing lead to source junction field plate breakdown, and the unwanted generation of hot carriers. The related application Ser. No. 07/219,529, discloses a memory cell configuration in which a Fowler-Nordheim tunnel window is located on a side of the source opposite the channel, and the junction under the tunnel window terminates under a relatively thick oxide thereby improving source junction field plate breakdown.

Accordingly, a need exists for an EEPROM that is programmed using only hot carrier injection, and is erased using only Fowler-Nordheim tunneling, in a contact-less array configuration. Such an EEPROM would take advantage of the relatively low voltage required for hot carrier injection programming while avoiding channel insulator damage due to hot hole erasure, thereby improving the durability and reliability of the memory cell, and the reduced number of array contacts would provide improved process yields (further improving reliability). In general, a satisfactory memory cell of this type would provide careful control over the channel and junction profile to achieve optimum efficiency for the hot carrier injection programming operation.

SUMMARY OF THE INVENTION

The present invention increases durability of an electrically erasable and programmable ROM (EEPROM) cell that uses hot carrier injection for programming, by using Fowler-Nordheim tunneling for erasing. The efficiency of injection programming is optimized by a suitably profiled channel with an abrupt drain junction, while substrate leakage and injection (hot hole) erasure is suppressed by a tunnel window configuration that increases source junction field plate breakdown voltage. Moreover, the programming junction and the erase junction can be optimized independently.

In one aspect of the invention, the injection-program/tunnel-erase EEPROM includes memory cells formed in the face of a semiconductor substrate of a first conductivity type, each including source and drain regions of a second conductivity type opposite the first type separated by a channel region. The source region includes a tunnel window subregion opposite the channel region.

A floating gate conductor is insulatively disposed over the channel region for controlling the voltage threshold for channel conductivity. The floating gate includes a tunnel window section insulatively disposed over the tunnel window subregion for establishing a Fowler-Nordheim tunnel current path. A control gate conductor is insulatively disposed over the floating gate.

The memory cell is programmed by transferring a selected charge from the channel to the floating gate by hot carrier injection in response to a set of programming voltages on the control gate and drain relative to the source. The memory cell is erased by removing a selected charge from the floating gate tunnel window section to the tunnel window subregion of the source by Fowler-Nordheim tunneling in response to an erasing voltage applied to the control gate relative to the source.

Preferably, the floating gate includes a channel section of a predetermined length, which is used during fabrication to align the source/drain junctions. The use of the channel section for self-aligning the channel region provides effective control of channel length, and facilitates junction profiling (such as by optimized doping and/or subsequent controlled heat treatment cycles) to create abrupt drain junctions, thereby increasing the efficiency of hot carrier injection for programming.

In more specific aspects of the invention, the injection-program/tunnel-erase EEPROM includes a memory array of contact-free floating gate field effect transistor cells fabricated in NMOS with buried N+ source and drain regions. The memory cells are configured in pairs, a column of cell-pairs being defined by two source bitlines and an intermediate shared drain bitline. Rows of cells are defined by control gate wordlines, with each cell-pair in a wordline row including two source regions and separated by respective channel regions from an intermediate shared drain region.

The floating gates are formed in two stages. In the first stage, a first-level conductive polysilicon (poly 1) layer P1A is formed over a channel oxide layer, and then patterned and etched to define parallel P1A channel section columns. These channel section columns are of a predetermined width, and each is used as an implant mask for implanting N+ source and drain bitlines on either side. The source/drain junctions are self-aligned with the edges of the P1A channel section column. Junction profile implants are used to create an abrupt drain junction (optimized for programming) and a sloped (graded) source junction (optimized for reading). A tunnel window implant is used to profile the tunnel window subregion of the source. Optionally, before the P1A channel section columns are formed, one or more channel implants may be used to profile the channel regions (such as using a threshold by using voltage adjust implant).

A thick oxide insulator is formed over the source and drain bitlines, on either side of the P1A channel section columns. To create a tunnel window insulator over each tunnel window subregion, a tunnel window oxide is formed that is substantially thinner than the channel oxide insulating the channel region from the floating-gate P1A channel section (about 100 Angstroms compared to about 200–400 Angstroms).

In the second stage of floating gate fabrication, the top of the P1A is cleared, followed by the formation of a conductive poly 1 layer P1B. The P1B is patterned and etched into columns that each extend over a corresponding P1A channel section, tunnel window and an intervening source-bitline thick oxide insulator, defining the floating gates in the wordline direction (i.e., establishing the floating gate length). A second-level conductive polysilicon (poly 2) layer is formed over the substrate, insulated from the P1B columns by an interlevel oxide layer.

A stack etch procedure is used to define wordline rows of memory cell-pairs (i.e., establishing floating gate width). Each wordline row includes a contiuous poly 2 control gate conductor capacitively coupled (through the interlevel oxide) to the P1A/P1B floating gates for each memory cell in that wordline. Each floating gate conductor extends across most of a memory cell, maximizing capacitive coupling to the overlying control gate (wordline).

During memory cell programming, appropriate programming voltages applied to selected and deselected control gate wordlines and source/drain bitlines create a high current condition in the corresponding channel region, injecting channel hot electrons and avalanche breakdown electrons across the channel oxide to the P1A channel section of the floating gate. During memory cell erasing, appropriate erasing voltages applied to the selected and deselected control gate wordlines and source/drain bitlines allow a Fowler-Nordheim tunnel current across the tunnel window oxide to remove a selected charge from the floating gate, without causing hot hole erasure from source junction field plate breakdown.

The technical advantages of the injection-program/tunnel-erase EEPROM cell of this invention include the following: (1) The memory cells are contact-less, saving chip area and improving manufacturing yield, and allowing a relatively planar topology. (2) The memory cell uses hot carrier injection for programming, allowing lower programming voltages than those required for Fowler-Nordheim tunneling. (3) It uses Fowler-Nordheim tunneling for erasing, avoiding damage to the channel oxide from hot hole erasure. (4) It uses a two-stage floating gate fabrication technique in which a floating gate channel section (P1A) is used to self-align the source/drain junctions, and profile the channel and the channel junctions for optimum injection efficiency. (5) The two-stage floating gate fabrication technique increases capacitive coupling between a control gate wordline and the floating gate P1B layer by maximizing overlap over the thick oxide covering the source bitline. (6) The memory cell is fabricated with a tunnel window located adjacent the source region opposite the source-channel junction, thereby enhancing the field plate breakdown voltage for the source junction and inhibiting hot hole injection during erasing. (7) The source and drain junctions can be optimized separately for reading and programming.

BRIEF DESCRIPTION OF THE DRAWINGS

For a more complete understanding of the present invention, and for other features and advantages, reference is now made to the following Detailed Description, read in conjunction with the accompanying Drawings, in which.

DETAILED DESCRIPTION OF THE INVENTION

The Detailed Description of the preferred embodiment of the injection-program/tunnel-erase EEPROM cell of the present invention is organized as follows:
1. Memory Cell Structure
2. Operation
3. Method of Fabrication
4. Conclusion The preferred embodiment of this invention is described in connection with an NMOS contact-less EEPROM array in which wordline rows of memory cells are configured in memory cell-pairs with two bitline source regions and a shared intermediate bitline drain region. This cell-pair mirror-image configuration is described in the related applications. This invention is routinely adaptable to any floating-gate field-effect type EEPROM.

1. Memory Cell Structure

Figure 1:
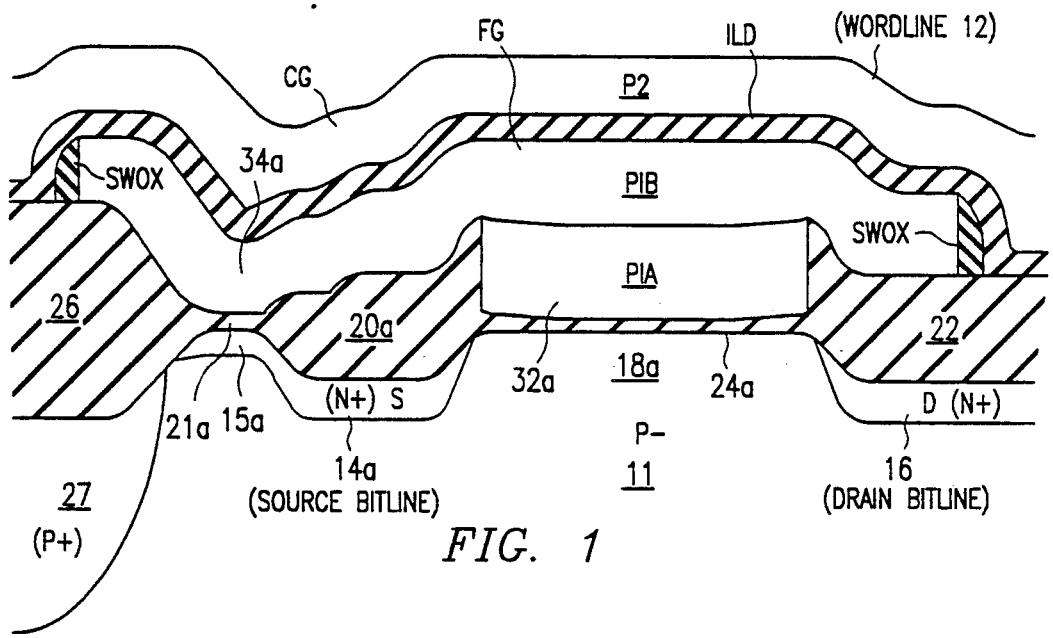
FIG. 1 is an enlarged elevation view of a memory cell according to the present invention.

As shown in FIG. 1, an array of electrically-erasable and programmable memory cell-pairs 10 is formed in a face of a P-type silicon substrate 11. Each memory cell-pair includes two separate memory cells 10a and 10b. Only memory cell 10a is shown in FIG. 1, cell 10b being the mirror configuration.

Figure 2:
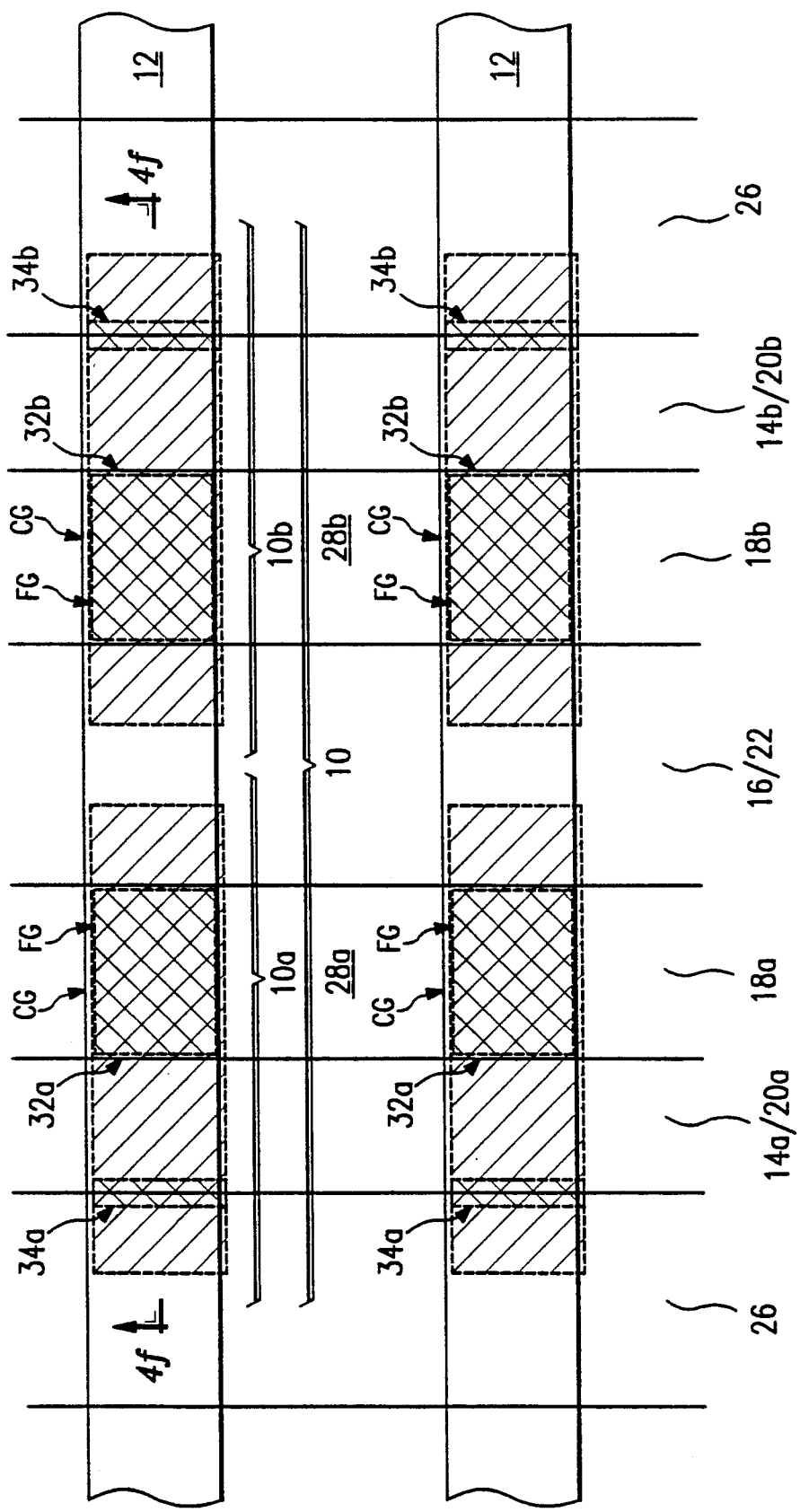
FIG. 2 is an enlarged plan view of a small part of a memory array, including memory cell pairs.

As shown in FIG. 2, multiple conductive wordlines 12, each defining a row of memory cell-pairs 10, are formed on the face of the substrate. A pair of buried N+ source bitlines 14a and 14b and an intermediate drain buried N+ bitline 16 define a column of memory-cell pairs 10 (memory cells 10a and 10b). The source and drain bitlines 14a/14b and 16 are N+ regions buried under thick oxide columns 20a/20b and 22. Cell-isolation thick field oxide columns 26 isolate memory cell-pairs in the wordline direction, while channel isolation stops 28a and 28b provide isolation between adjacent N+ lines 14 and 16, as well as between adjacent cells in adjacent wordlines.

A wordline 12 forms the control gate conductors CG for the memory cells in the wordline. Floating gate conductors FG extend across a memory cell (aligned with a respective wordline control gate), and include a channel section 32a/32b and a tunnel window section 34a/34b. The wordlines (a second-level polysilicon) are actually aligned to the floating gate conductors (a first-level polysilicon)— the slight offset depicted in the FIGURE is for the purpose of clarity (see Section 3).

As shown in FIG. 1, for a memory cell 10a, the buried N+ bitline 14a provides a source region S, while the intermediate buried N+ bitline 16 provides a shared drain region D. The source region S includes a tunnel window subregion 15a. Channel region 18a lies between the source (bitline 14a) and the drain (bitline 16).

The source bitline 14a is buried beneath thick oxide 20a, with the tunnel window subregion 15a being insulated by tunnel window oxide 21a. The drain bitline 16 is buried beneath thick oxide 22. The channel region 18a is insulated by channel oxide 24a. The memory cell 10 is isolated from the adjacent memory cell-pair by thick field oxide 26, which overlies an implanted P+ stop 27. Tunnel window oxide 21a is self-aligned between the source-bitline thick oxide 20a and the cell-isolation thick oxide 26, defining a Fowler-Nordheim tunnel region.

For each memory cell 10a (or 10b), wordline 12 (FIG. 2) forms a control gate conductor CG. An underlying floating gate conductor FG is insulated from the control gate conductor CG by an interlevel dielectric (e.g., oxide) layer ILD, and from the channel region 18a by the channel oxide 24a. Thus, each memory cell-pair 10 includes two floating gate field effect transistors 10a and 10b formed by a common control gate conductor CG (wordline 12), respective floating gates FG, respective sources S (bitlines 14a and 14b), a common drain D (bitline 16), and respective channel regions 18a and 18b.

Each floating gate conductor FG is formed in two stages from separate first-level polysilicon (poly 1) layers P1A and P1B. The first poly 1 layer P1A is used to self-align the underlying channel region, both in terms of channel length and source/drain junctions, and forms a channel section 32a. The second poly 1 layer P1B extends across the cell, covering the channel section 32a (P1A) and forming a tunnel window section 34a.

The floating-gate channel section 32a (P1A) is capacitively coupled to the channel region through a relatively thin channel oxide 24a (about 200–400 Angstroms), and the floating-gate tunnel window section 34a (P1B) is capacitively coupled to the tunnel window subregion through an even thinner (about 100 Angstroms) tunnel window oxide 21a. The floating gate FG extends from the cell-isolation insulator 26 to the drain bitline insulator 22, over the thick oxide 20a burying the N+ source bitline, enhancing capacitive coupling to the control gate CG (wordline 12).

As described in Section 4, the first-stage poly 1 layer P1A provides a self-aligning implant mask for the buried N+ source/drain regions. Various implant procedures can be used to tailor the source/drain junctions for optimum programming and reading efficiency. For programming efficiency, the drain junction is tailored to exhibit an abrupt profile that facilitates hot carrier injection. For disturb-free reading, the source junction is tailored to exhibit a sloped (graded) profile.

Figure 3:
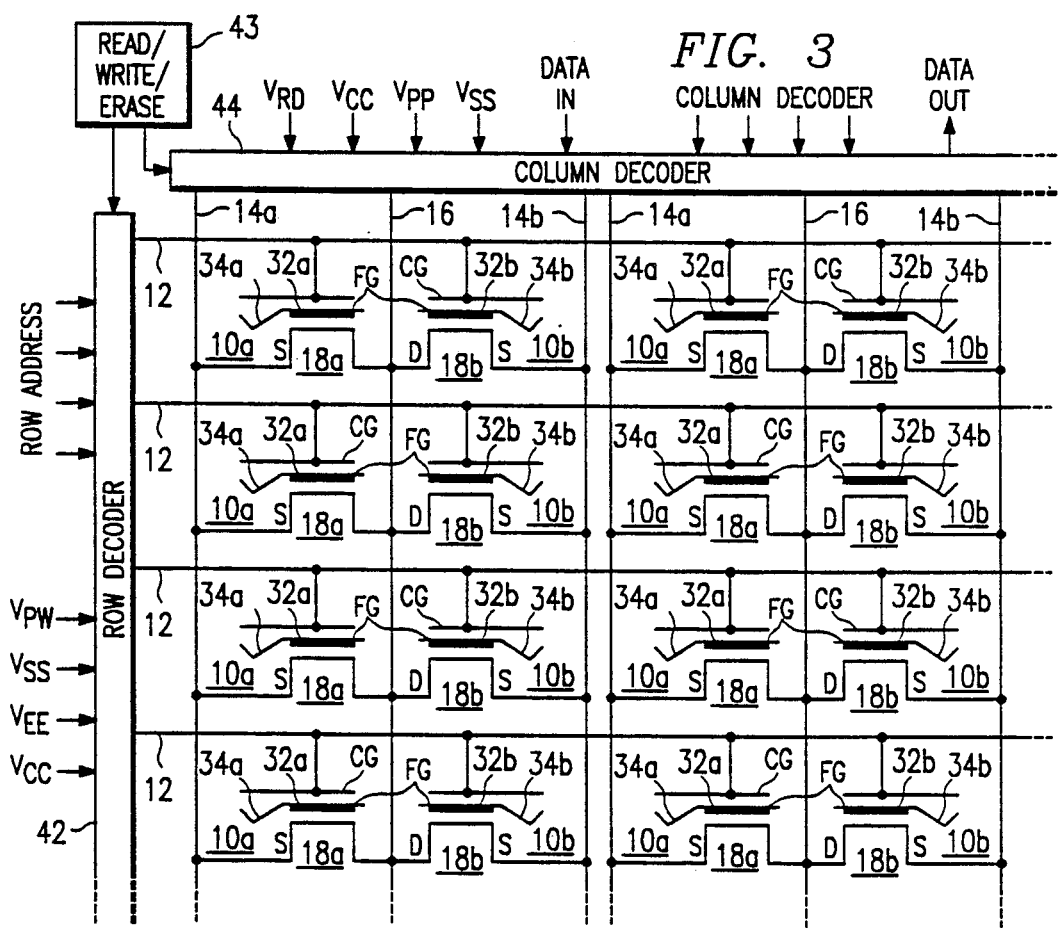
FIG. 3 is an electrical schematic diagram of a portion of a memory cell array.

A portion of an array of memory cells according to the invention is shown in an exemplary memory chip configuration in FIG. 3. Each memory cell-pair is formed by separate floating gate transistors 10a/10b, each having a source S, a control gate CG, and a floating gate FG with a channel section 32a and a tunnel window section. In addition, each pair of floating gate transistors has a shared drain D.

The control gate for each memory cell in a row is formed by a wordline 12, and all wordlines are connected to a row decoder 42. The source electrodes S in a column of cells are formed by the source bitlines 14a/14b, while the shared drain electrodes D in a column of cells are formed by the shared drain bitlines 16.

The source bitlines 14a/14b and the shared drain bitlines 16 are coupled to a column decoder 44.

The memory cells are contact-free, in that no electrical contacts near the source or drain are used. As described in the related application, Ser. No. 07/374,381, filed on June 30, 1989, contacts are made between the diffused bitlines 14a/14b and 16 and respective metal contact bitlines overlying them.

The memory cell-pair configuration of the preferred embodiment is not critical to the present invention, but is a matter of routine design choice. Alternative memory cell configurations may be adapted to use various aspects of this invention, including Fowler-Nordheim tunneling for erasing and channel and junction profiling to enhance avalanche-injection efficiency.

2. Operation

The program/erase and read operations of the avalanche-program/tunnel-erase EEPROM of this invention are summarized in the following Operations Table (the voltages are approximate). The following discussion concerns only the programming/erasing voltages outlined in the Operations Table —using intermediate transition voltages is conventional, and need not be described in detail.

OPERATIONS TABLE
PROGRAM/ERASE/READ VOLTAGES

| | Program (Hot Carrier Injection) | Erase (F-N Tunneling) | Read |
|---|---|---|---|
| Selected Wordline (Control Gate) | $V_{FW}$ (+10 v) | $V_{EE}$ (−10 v) | $V_{CC}$ (+5 v) |
| Deselected Wordlines (Control Gate) | $V_{SS}$ (0 v) | $V_{EE}$ (−10 v) | $V_{SS}$ (0 v) |
| Selected Source Bitline | $V_{SS}$ (≈0 v) | $V_{CC}$ (+5 v) | $V_{SS}$ (0 v) |
| Deselected Source Bitline | Float | $V_{CC}$ (+5 v) | Float |
| Selected Drain Bitline | $V_{PP}$ | Float | $V_{RD}$ (1.5 v) |
| Deselected Drain Bitline | Float | Float | Float |

The programming voltages applied to the selected deselected wordlines and source/drain bitlines cause sufficient field strength within the channel of a selected memory cell to generate the high channel currents necessary for hot carrier (channel hot electron and avalanche breakdown electron) injection across the channel oxide to the floating gate in the area of the channel region adjacent the drain. The erasing voltages applied to wordlines and source bitlines (the drain bitline floats) cause sufficient field strength across the tunnel window oxide to generate a Fowler-Nordheim tunneling current from the floating gate to the tunnel window subregion of the source. Because the drain is floated, and because the tunnel window is located remote from the source junction and the source junction terminates under an oxide thicker than tunnel oxide, the tunnel erase voltages are not sufficient to cause hot hole erasure through field plate breakdown of the source junction.

The program/erase and read operations are described in connection with the exemplary memory array configuration in FIG. 3. The row decoder 42 and the column decoder 44 receive respective row and column addresses, which are decoded to determine the corresponding selected and deselected columns and rows that identify a particular cell for data input (program/erase) or output (read).

In the write or program mode, the column decoder 44 responds to a "0" or "1" data input by applying a high voltage $V_{PP}$ to a selected drain bitline 16, and a low voltage $V_{SS}$ (or ground) to a selected source bitline 14a/14b—all of the deselected drain and source bitlines are allowed to float. The row decoder 42 correspondingly applys a high voltage $V_{PW}$ (about 10 V) to a selected wordline 12, and a low voltage $V_{SS}$ (or ground) to the deselected wordlines.

An alternative programming method is to bring all deselected sources/drains not common to the selected cell pair to $V_{SS}$ (or ground), while the deselected source common to the selected cell pair is left floating.

These programming voltages create a high current (source to drain) condition in the channel of the selected memory cell, resulting in the generation near the drain junction of channel hot electrons and avalanche breakdown electrons that are injected across the channel oxide to the floating gate FG (i.e., the floating-gate channel section 32a). The programming time is selected to be sufficiently long to program the floating gate with a negative program charge of about −2 to −4 volts.

For memory cells fabricated in accordance with the preferred embodiment, the coupling coefficient between a control gate/wordline and a floating gate is about 0.6. Therefore, a programming voltage of +10 volts on a selected wordline conductor places a voltage of about 6–7 volts on the floating gate. The voltage difference between the floating gate at about 6–7 volts and the grounded (0 v) selected source bitline is insufficient to cause a Fowler-Nordheim tunneling current to charge the floating gate conductor.

In the erase mode, the column decoder 44 applys the voltage $V_\alpha$ (about 5 V) to all of the source bitlines 14a/14b, and allows the drain bitlines 16 to float. The row decoder 42 applys a block erasing voltage $V_{EE}$ (about −10 V) to all of the wordlines 12.

These erasing voltages create sufficient field strength across the tunnel window oxide between the floating gate tunnel window section 34a and the source tunnel window subregion that a Fowler-Nordheim tunnel current is generated to transfer charge from the floating gate, erasing the memory cell. Because of the negative potential on the wordline, the cell remains in the non-conducting state during erase, and therefore, no channel hot carriers are generated. The field plate breakdown voltage of the source bitline junction is high enough to inhibit hot hole injection.

In the read mode, all drains are held at $V_{RD}$ (about 1.5 v), and all sources are grounded. For the sake of clarity, the table shows the selected source bitline at $V_{RD}$ (about 1.5 v), and a low voltage $V_{SS}$ (or ground) on the selected drain bitline 14a/14b, all deselected drain and source bitlines being allowed to float. The row decoder 42 applys a positive voltage $V_\alpha$ (about 5 V) to a selected wordline 12, and a low voltage $V_{SS}$ to all deselected wordlines. The column decoder 44 responds to a column address by connecting the sense amplifier to the selected source.

These read voltages are sufficient to determine channel impedance for the selected cell but insufficient to create either hot carrier injection or Fowler-Nordheim tunneling that would disturb the charge condition of any floating gate.

3. Method of Fabrication

A method of fabricating the preferred embodiment of the injection-program/tunnel-erase EEPROM cell-pair is described with reference to FIGS. 4a–4f and 1, which are cross-sectional elevation views taken along section line 4f—4f in FIG. 2 (i.e., through approximately the center of a wordline 12). Conventional photolithographic techniques well known in the art are used. These figures, and the various layers and areas, are not drawn to any absolute or relative scale, but are for illustrative purposes only.

The starting material is a slice of P-type silicon of which the substrate 11 is only a small portion. The slice is perhaps 6 inches in diameter, while an individual member cell is only a few microns wide. A number of process steps would normally be performed to create transistors peripheral to the memory array, and these will not be discussed. For example, the EEPROM memory device may be of the complementary field effect type (CMOS) having N-wells and P-wells formed in the substrate as part of a prior process to create peripheral transistors.

Figure 4A:
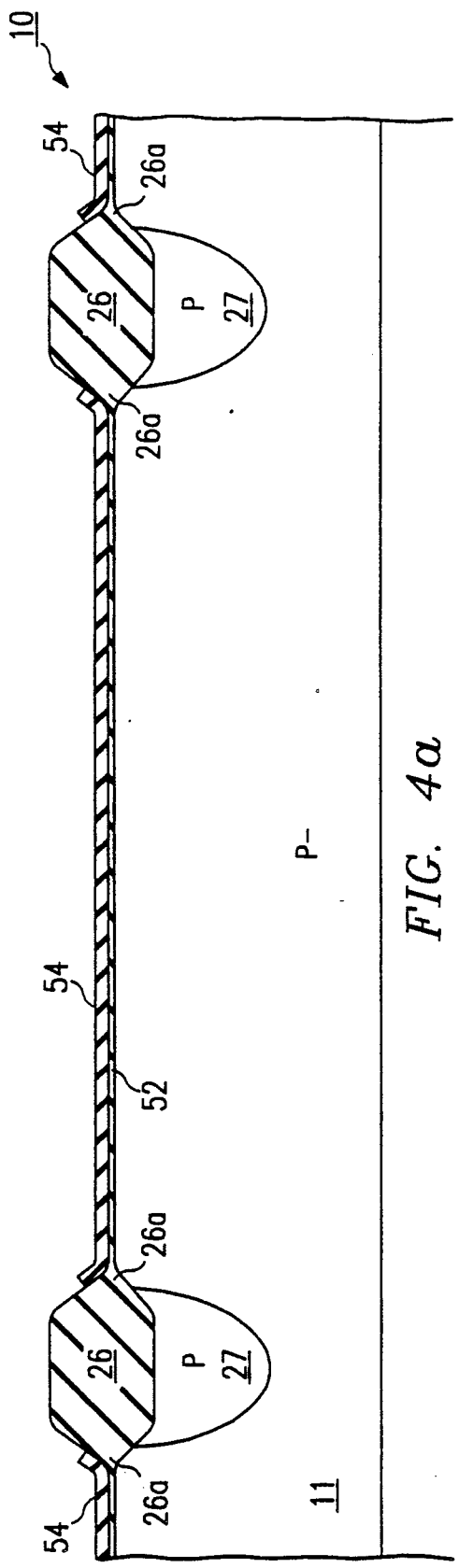
FIGS. 4a-4f are elevation views in section of a memory cell pair at successive fabrication stages.

As shown in FIG. 4a, a pad oxide layer 52 is grown or deposited on the face of substrate 11, to a depth of about 400 Angstroms—this pad oxide protects the substrate during the initial fabrication steps and will be subsequently removed. A silicon nitride layer 54 is deposited over the oxide using low pressure chemical vapor deposition (LPCVD). The oxide/nitride is patterned and plasma etched to define areas for memory cell-pairs 10, leaving oxide/nitride over the regions that will be the channels, tunnel windows, sources and shared drain, while exposing the columnar areas where the cell-isolation thick field oxide 26 is to be formed.

A boron implant at a dose of about $8 \times 10^{12}$ cm$^{-2}$ is performed to create a P+ channel stop 27 that will isolate the source bitlines for adjacent cell-pairs. After removing the photoresist, the thick field oxide that forms the cell-isolation areas 26 is thermally grown in a localized oxidation process to a thickness of about 6000–10000 Angstroms by exposure to steam at about 900C.° and one atmosphere for several hours. Alternatively, a high pressure oxidation (Hipox) can be used to decrease oxidation time. The oxide grows beneath the edges of the nitride 54, creating "bird's beak" areas 26a instead of abrupt transitions.

Next, the remaining portions of the pad oxide/nitride layers are removed. This procedure exposes the silicon substrate between the cell-isolation thick field areas 26, in preparation for regrowing gate oxide.

At this point, with the substrate surface exposed between the cell-isolation areas 26, channel implants can be performed for channel optimization, using conventional techniques. For example, after appropriately patterning the substrate face with photoresist (leaving the channel regions exposed), one or more boron implants can be used for threshold voltage adjustment (VT$_A$) and to tailor junction gradation, achieving a desired channel profile (doping and depth).

Figure 4B:
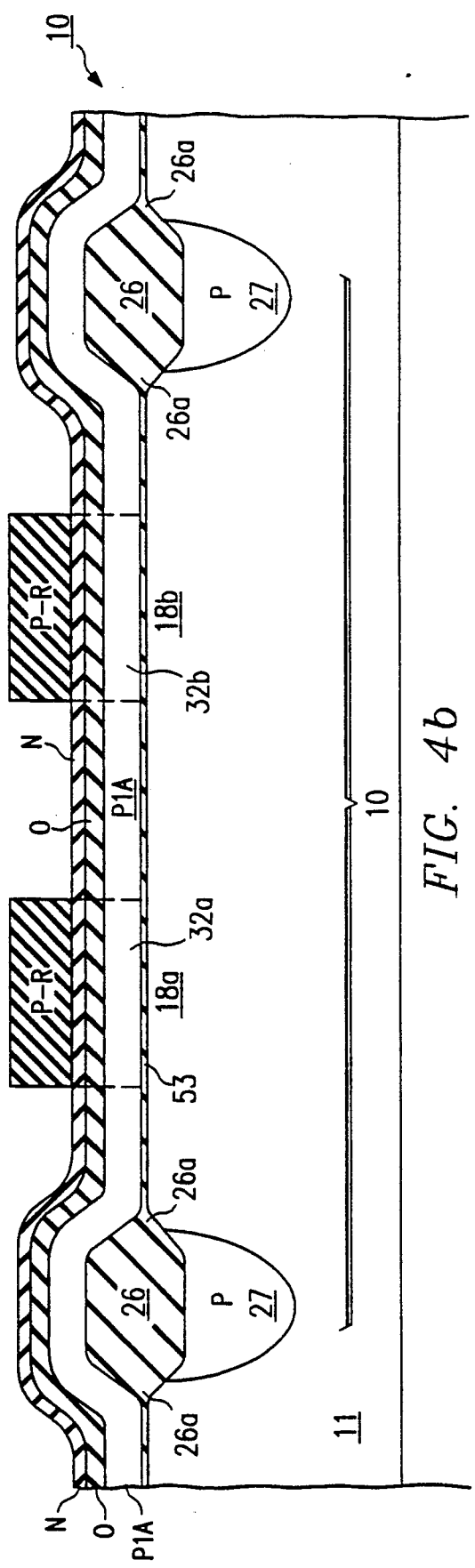

With reference to FIG. 4b, after channel profiling and/or VT$_A$ implants, a high quality gate oxide 53 is thermally grown by exposing the slice to an oxidizing ambient at elevated temperatures by conventional methods. The gate oxide covers the silicon substrate between the cell-isolation areas 26 to a thickness of about 200–400 Angstroms.

The first stage of the process of forming the floating gate conductors is performed by depositing a layer of first-level polysilicon (poly 1) over the substrate face. This first-stage poly 1 layer P1A is deposited to a thickness of about 2000–4000 Angstroms over gate oxide layer 53 (and the cell-isolation areas), and is highly doped N+ with phosphorous to render it conductive.

The poly 1 layer P1A is covered by an oxide/nitride layer. Oxide is deposited (or grown by oxidation of the poly 1) over the poly 1 layer P1A, and nitride is deposited over the oxide, both to a thickness of about 200–400 Angstroms. The nitride provides a hard protective cover, while the oxide provides an intermediate thermal-expansion buffer layer.

The P1A/oxide/nitride layers are patterned with photoresist P-R, to define channel columns (indicated by dashed lines) corresponding to the channel regions 18a/18b. A plasma etch procedure removes the unprotected P1A/oxide/nitride and gate oxide, exposing the silicon surface (and the thick field oxide areas), leaving the channel section columns. The remaining portion of the poly 1 layer P1A that is included in the channel section columns will become floating gate P1A channel sections 32a/32b (see FIG. 1).

The P1A channel sections formed by the poly 1 layer P1A are configured with a predetermined length, and are used in later fabrication steps as an implant mask to establish the length of the channel regions 18a and 18b. In this manner, channel length can be tailored for optimum efficiency of hot carrier injection from the channel region to the floating gate (i.e., to the P1A channel sections).

Figure 4C:
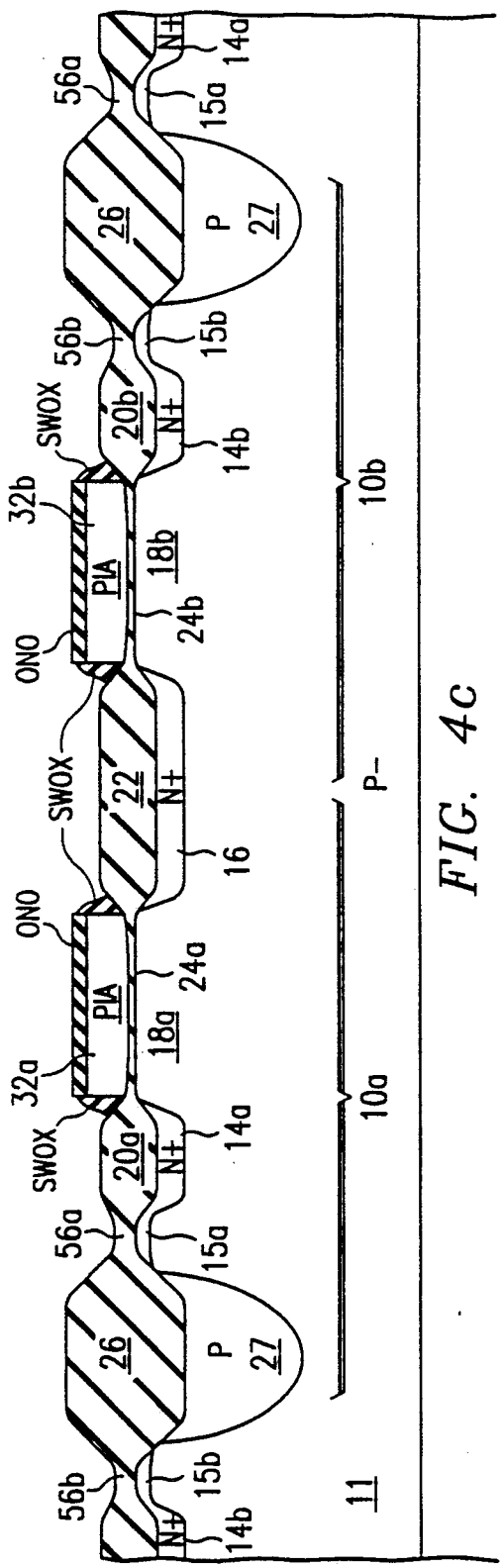

With reference to FIG. 4c, after the P1A/oxide/nitride channel columns are defined, the next step is to implant, on either side of those columns, the columnar N+ source bitlines 14a/14b, and the shared columnar N+ drain bitlines 16. The P1A channel sections 32a/32b (i.e., the P1A/oxide/nitride channel columns with photoresist in place) form an implant mask covering channel regions 18a/18b. An arsenic implant is performed at a dosage of about $6 \times 10^{15}$ cm$^{-2}$ at about 135 Kev to create the self-aligned N+ source/drain bitlines (which provide the source S and drain D for each memory cell-pair 10 in the corresponding bitline column of memory cell-pairs).

At the channel region, the junctions of the N+ source bitlines 14a/14b and drain bitline 16 are self-aligned with the corresponding edges of the overlying floating gate P1A channel sections 32a/32b. The N+ implant-drive associated with this implant procedure (and, indirectly, with subsequent thermal procedures), and junction tailoring implants, are used for junction profiling.

That is, the N+ implant-drive associated with forming the N+ bitlines in this implant step results in some diffusion of the arsenic dopant under the corresponding edges of the masking P1A channel sections 32a/32b, i.e., into self-aligned channel regions 18a/18b as defined by the P1A channel sections. By controlling the N+ implant-drive, the diffusion of the arsenic dopant into the channel regions 18a/18b, under the P1A channel sections, can be minimized, and these source/drain junctions maintained in fairly abrupt alignment with the corresponding edges of the P1A channel sections.

After the arsenic implant, a phosphorous implant of a suitable energy can be used in the source bitlines 14a/14b (after covering the drain bitline with photoresist), to tailor the source junction for a more sloped junction profile. Using a source junction tailoring implant yields optimized junction profiles by providing a relatively sloped source junction for erasing/reading, without affecting the relatively abrupt drain junction used for programming. This source/drain junction profile can be maintained throughout the remainder of the fabrication process by carefully controlling subsequent heat treatment cycles to minimize further N+-drive.

Following the implant of source bitlines 14a/14b and drain bitline 16, the photoresist is stripped from the top of the P1A/oxide/nitride channel columns, and the substrate is annealed at about 900°-1000° C. for about 30 minutes in an annealing ambient to repair the implant damage and for junction drive.

A local silicon oxidation procedure is then performed to thermally grow source-bitline thick oxide areas 20a and 20b, and drain-bitline thick oxide area 22, burying the corresponding bitline N+-lines. This thermal oxidation procedure is performed with steam at about 900° C. to grow thick oxide to a thickness of about 1500 to 3000 Angstroms (a high pressure oxidation can also be used for this step). During thermal oxidation, some of the nitride covering each channel column is converted to oxide creating an ONO (oxide/nitride/oxide) layer over the P1A channel sections.

Again, the floating-gate P1A channel sections 32a/32b (i.e., the P1A/ONO channel columns) act as a mask for this oxidation procedure. In addition to oxidizing the exposed silicon substrate, some of the poly 1 layer P1A near the edges is also converted to oxide, thickening the gate oxide in those areas (illustrated as an upwardly curved P1A/gate oxide interface in FIG. 4c). In addition, oxide grows on the sides of the P1A/ONO columns, forming sidewall oxides SWOX.

This oxidation procedure also grows additional oxide 56a/56b, above the tunnel window subregions 15a/15b of the buried N+ source regions 14a/14b, i.e., between the source-bitline thick oxide 20a and the cell-isolation field oxide 26. Due to the presence of the "bird's beak" portions 26a of the cell-isolation areas, the source/drain arsenic implant is partially masked, so that the concentration of the arsenic dopant in this tunnel window subregion is lower than the arsenic concentration in the rest of the source bitlines. As a result, oxide growth in the tunnel window subregions is considerably less than the thick oxide growth over the source bitlines. The thickness of this intervening oxide 56a/56b is not important, since it will be etched and tunnel window oxide regrown to a relatively precise thickness.

Figure 4D:
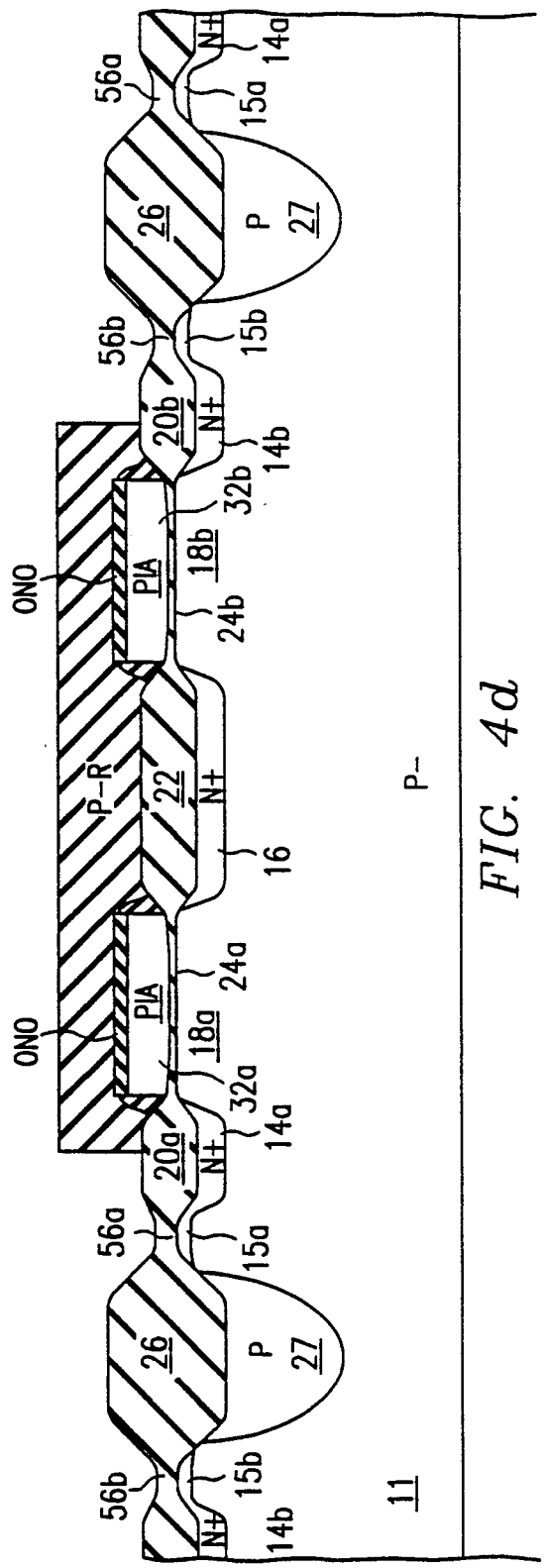

With reference to FIG. 4d, the next procedure is to form the Fowler-Nordheim tunnel windows. Photoresist P-R is applied over the P1A/ONO columns and the drain-bitline thick oxide 22, and a portion of the source-bitline thick oxide areas 20a/20b. This photoresist step exposes the region at the interface between the cell-isolation field oxide 26 and the source-bitline thick oxide 14a/14b, i.e., above tunnel window subregions 15a/15b. The exposed tunnel window subregions are implanted with phosphorus at a dosage of about $10^{14}$ cm$^{-2}$, through the overlying oxide (56a/56b in FIG. 4C).

The exposed oxide covering the tunnel window subregions 15a/15b is then etched down to the silicon substrate. This etch process also correspondingly etches the exposed portions of the source-bitline thick oxide 20a/20b, and the cell-isolation field oxide 26. As an alternative to the phosphorous implant, an arsenic implant can be used after the tunnel window etch has exposed the silicon substrate, followed by annealing.

The photoresist is removed, and relatively thin tunnel window oxides 21a/21b are then grown to a thickness of about 100 Angstroms, forming the Fowler-Nordheim tunnel windows. Because of the curved surface of the oxide in the tunnel window prior to etching, the width of the regrown tunnel window oxides 21a/21b is controlled by varying the length of time for the etching process.

Optionally, the silicon surfaces of the tunnel windows can be textured by etching off about 800 Angstroms of silicon substrate prior to regrowing the tunnel window oxides 21a/21b. The tunnel window oxides 21a/21b are then regrown at about 950° C. under an oxygen atmosphere containing hydrogen chloride until the desired window thickness of about 100-300 Angstroms is attained. With the silicon surface textured in this manner, the Fowler-Nordheim tunneling starting field is reduced from about 10 megavolts/cm to about 3-5 megavolts/cm for the negative or positive voltage polarities, respectively.

Figure 4E:
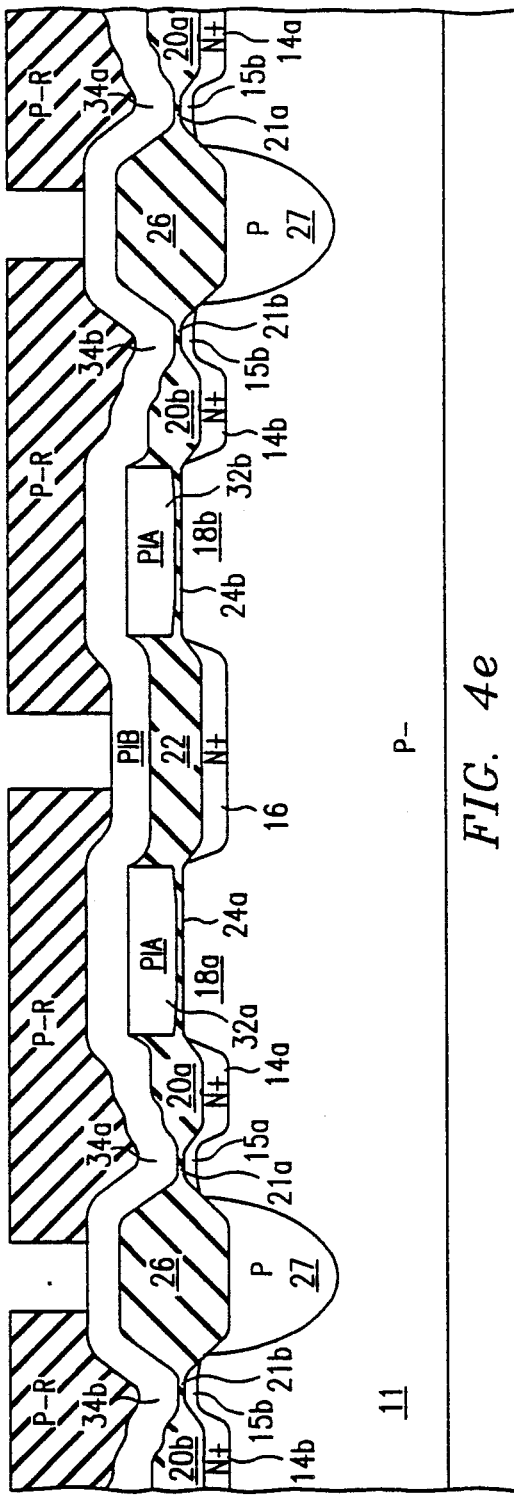
Figure 4F:
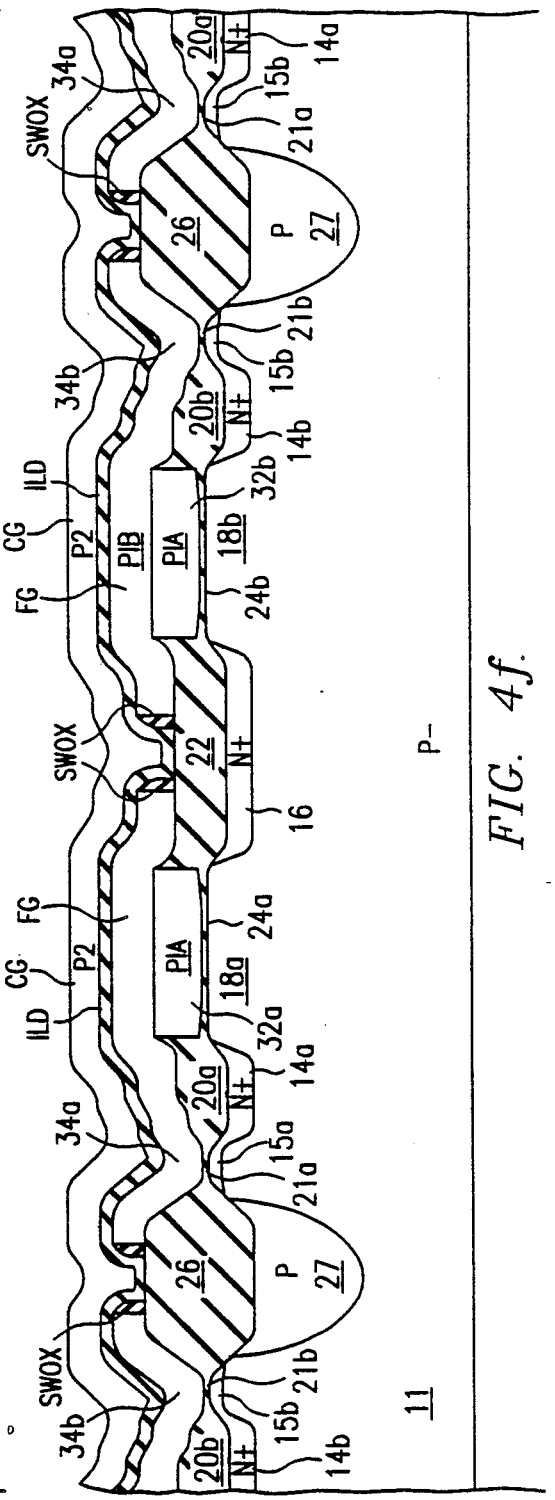

With reference to FIG. 4e, the second stage in forming the floating gate conductors is now performed. The tunnel windows are protected with photoresists, and the top surfaces of the floating-gate P1A channel sections 32a/32b are cleared of ONO. A second-stage poly 1 layer P1B is then deposited over the face of the slice to a thickness of about 2000 to 4000 Angstroms, and is highly doped N+ to render it conductive.

This P1B layer is then patterned with photoresist P-R to define the floating gates in the wordline direction (i.e., to define the length of the P1B portion of the floating gate). An etch procedure is used to remove unprotected portions of the P1B layer over the drain-bitline thick oxide 22 and the cell-isolation thick oxide 26, completing definition of the floating gate conductors FG in the wordline direction. That is, this second-stage poly 1 layer P1B is etched to define floating gate columns that in turn define floating-gate length. Definition of floating-gate width is accomplished in a later stack etch procedure.

The P1B portion of a floating gate conductor completely covers, and is in intimate contact with, the P1A channel section, extending over a portion of a drain-bitline thick oxide area 22, all of a source-bitline thick oxide area 20a/20b and over a portion of a cell-isolation thick oxide area 26. Thus, each floating gate conductor includes a P1A channel section 32a/32b capacitively coupled to the channel 18a/18b through channel oxide 24a/24b, and a tunnel window section 34a/34b capacitively coupled to the tunnel window subregion 15a/15b of the buried N+ source bitline 14a/14b through a tunnel window oxide 21a/21b.

With reference to FIG. 4, after the floating gate fabrication, about 3000-5000 Angstroms of oxide is deposited, and anisotropically etched back to create sidewall oxides SWOX at the ends of a floating gate column (i.e., at the ends of the P1B portions of the floating gates). An interlevel dielectric layer ILD such as ONO (oxide/nitride/oxide) of equivalent oxide (electrical) thickness in the range of 200-400 Angstroms is formed on the P1B layer by conventional techniques.

A second-level polysilicon (poly 2) layer P2 is deposited over the face of the substrate and highly doped N+ to make it conductive. This poly 2 layer is deposited to a thickness of about 2000-4500 Angstroms, and deglazed.

Next, a stack etch procedure is used to creat the wordlines that correspond to rows of memory cellpairs. Photoresist (not shown) is applied to define wordline stacks that include (a) the poly 2 layer P2, (b) the ONO interlevel dielectric layer ILD, and (c) the poly 1 layer P1A/P1B that forms the floating gate conductors. The stack etch defines a plurality of elongated wordlines 12 running substantially parallel in the wordline direction (see FIG. 2), defining the width (bitline direction) of the P1A/P1B floating gates FG and in particular the width of the P1A channel sections 32a/32b.

Thus, the stack etch produces a wordline conductor (poly 2) continuous in the wordline direction that provides a control gate CG for each memory cell in the wordline row. The control gate CG is capacitively coupled to respective underlying floating gates FG through the corresponding portion of the interlevel oxide ILD.

Channel-isolation areas (28a/28b in FIG. 2) can now be created. The stack etch procedure can be controlled either to etch down into the gate oxide layer, or to trench etch into the silicon substrate. If junction isolation is to be used, a self-aligned P+ implant step is performed, using the wordline stack as a mask to create P+ channel stops. For this purpose, boron is implanted at a dose of about $10^{12}$ cm$^{-2}$ at about 70 KeV. After annealing and oxidation, this implant produces P+ channel stops in substantially the same manner as cell-isolation P+ implants 27. An oxide is then grown over the P+ channel stops to complete the channel isolation areas.

Alternatively, these areas can be created in the first field oxide procedure that created the cell-isolation areas 26/27. In this case, stack layers P2, ONO, P1B and P1A will overlap the field oxide region 28a/28b.

Peripheral logic CMOS devices may now be completed.

Finally, an oxide layer (not shown) is grown over the face, including over all wordlines 12, and a borophosphosilicate glass layer (not shown) is then deposited. Off-array contacts (not shown) are made through the BPSG layer, as are on-array contacts that are made from metal bitlines (not shown) to respective diffused source/drain bitlines 14a/14b and 16. The metal bitlines are formed on the BPSG layer to run over and parallel to the respective diffused bitlines.

4. Conclusion

The injection-program/tunnel erase EEPROM cell of this invention provides an EEPROM memory cell that is electrically programmable using hot carrier injection (channel hot electrons and avalanche breakdown electrons), and is electrically erasable using Fowler-Nordheim tunneling. The invention takes advantage of the lower programming voltages required for hot carrier injection, while avoiding disadvantageous channel oxide damage caused by hot carrier erasure.

The memory cell uses a floating gate structure that includes a channel section and a tunnel section. The floating-gate channel section is formed over the channel region, being of a predetermined length corresponding to the desired length of the channel region. The source/drain junctions are self-aligned with the edges of the floating gate channel section to establish channel length. Junction and channel tailoring implants are used to optimize the junction and channel profiles for maximum programming and reading efficiency.

The floating-gate tunnel window section is capacitively coupled to a tunnel window subregion of the buried N+ source region through a thin tunnel window oxide (about 100 Angstroms). The tunnel window subregion, and therefore the tunnel window, are located on the side of the source region opposite the source junction, which terminates under oxide that is thicker than the tunnel oxide, thereby enhancing source junction field plate breakdown voltage (and inhibiting hot carrier erasure)

The floating gate conductor is formed in a two-stage procedure, in which a first-stage poly 1 layer P1A is first deposited and etched to define bitline columns corresponding to the desired length of the channel regions. A second-stage poly 1 layer P1B is then formed, covering the channel section P1A and extending over the source bitline to form the tunnel window section.

Although the present invention has been described with respect to a specific, preferred embodiment, various changes and modifications may be suggested to one skilled in the art, and it is intended that the present invention encompass such changes and modifications as fall within the scope of the appended claims.

What is claimed is:

1. An electrically erasable, electrically programmable read-only memory cell formed in a face of a semiconductor substrate of a first conductivity type, comprising:
   source and drain regions of a second conductivity type opposite the first type, formed in the substrate and separated by a channel region;
   said source region including a Fowler-Nordheim tunnel window subregion located opposite said channel region;
   a floating gate conductor insulatively disposed over said channel region for controlling channel conductivity;
   said floating gate having a first channel section layer and a second layer overlying and in contact with said first channel section layer;
   said first channel section layer being insulatively disposed over said channel region, said channel region being defined by source and drain region junctions which are substantially aligned with edges of said first channel section layer;
   said second layer including a tunnel window section insulatively disposed over said tunnel window subregion for establishing a Fowler-Nordheim tunnel current path; and
   a control gate conductor insulatively disposed over said floating gate conductor;
   the memory cell being programmable by transferring a predetermined charge to said floating gate conductor by hot carrier injection in response to programming voltages applied to said control gate conductor and said drain region relative to said source region;
   the memory cell being erasable by removing a predetermined charge from said floating gate conductor by Fowler-Nordheim tunneling in response to an erasing voltage applied to said control gate conductor relative to said source region.

2. The memory cell of claim 1, wherein said channel region includes a dopant of the first conductivity type for adjusting the threshold voltage for said channel region.

3. The memory cell of claim 2, wherein said source region includes a dopant of said second conductivity type for creating a sloped source junction profile.

4. The memory cell of claim 1, wherein a channel insulator layer between said first channel section layer and said channel region is significantly thicker than a tunnel window insulator layer between said tunnel window section and said tunnel window subregion.

5. The memory cell of claim 4, wherein said source tunnel window subregion includes a dopant of the second conductivity type.

6. The memory cell of claim 1, further comprising thick insulator areas over said source and drain regions, said floating gate conductor extending entirely over said source insulator area between said channel region and said tunnel window subregion.

7. The memory cell of claim 6, wherein said drain region is shared with an adjacent identical memory cell.

8. The memory cell of claim 7, further including thick field insulator isolation areas formed in the substrate on either side of the pair of memory cells, adjacent respective source regions with respective tunnel window subregions in between, thereby isolating the memory cell-pair from adjacent memory cell-pairs.

9. An array of electrically-erasable, electrically-programmable read-only memory cells formed in a face of a semiconductor substrate of a first conductivity type, comprising:
  a plurality of parallel source and drain bitlines, of a second conductivity type opposite the first type, formed in columns in the substrate;
  a plurality of parallel control gate wordline conductors formed over the substrate substantially perpendicular to said source and drain bitlines, each defining a row of memory cells;
  each memory cell including respective source and drain regions of said source and drain bitlines, with a channel region in between, and a control gate conductor formed by a corresponding portion of a control gate wordline conductor substantially overlying said source, drain and channel regions;
  for each memory cell, a floating gate conductor insulatively disposed between said control gate conductor and said channel region for controlling the conductivity of said channel region based on a selected program charge stored on said floating gate conductor;
  for each memory cell, said source region including a Fowler-Nordheim tunnel window subregion located opposite said channel region;
  for each memory cell, said floating gate conductor having a first channel section layer and a second layer overlying and in contact with said first channel section layer;
  said first channel section layer being insulatively disposed over said channel region, said channel region being defined by source and drain region junctions which are substantially aligned with edges of said first channel section layer;
  said second layer including a tunnel window section insulatively disposed over said tunnel window subregion for establishing a Fowler-Nordheim tunnel current path;
  said memory cell being programmable by transferring a predetermined charge to said floating gate by hot carrier injection in response to programming voltages applied to said control gate and said drain relative to said source regions;
  the memory cell being erasable by removing a predetermined charge from said floating gate by Fowler-Nordheim tunneling in response to an erasing voltage applied to said control gate relative to said source region, thereby causing a Fowler-Nordheim tunnel current from said tunnel window section to said tunnel window subregion.

10. The memory array of claim 9, wherein, for each memory cell, said channel region includes a dopant of the first conductivity type for adjusting the threshold voltage for said channel region.

11. The memory array of claim 10, wherein, for each memory cell, said source region includes a dopant of said second conductivity type for creating a sloped source junction profile.

12. The memory array of claim 9, wherein for each memory cell, a channel insulator layer between said first channel section layer and said channel region is significantly thicker than a tunnel window insulator layer between said tunnel window section and said tunnel window subregion.

13. The memory array of claim 12, wherein said tunnel window subregion includes a dopant of the second conductivity type.

14. The memory array of claim 9, further comprising:
  thick insulator areas over said source and drain bitlines;
  for each memory cell, said second layer of said floating gate conductor extending over said source insulator area between said channel region and said tunnel window subregion.

15. The memory array of claim 14, wherein a column of memory cell-pairs is defined by separate source bitlines with an intermediate drain bitline, such that for each memory cell-pair, separate source regions share a single drain region.

16. The memory array of claim 15, further including thick field insulator isolation areas formed in columns on the substrate on a side of said source bitlines opposite said intermediate drain bitline, with respective tunnel window subregions of said source bitline in between, thereby isolating a column of memory cell-pairs from adjacent columns.

* * * * *